United States Patent
Setta

(10) Patent No.: US 9,455,271 B1
(45) Date of Patent: Sep. 27, 2016

(54) SEMICONDUCTOR MEMORY DEVICE AND METHOD OF MANUFACTURING SEMICONDUCTOR MEMORY DEVICE AND METHOD OF LAYOUTING AUXILIARY PATTERN

(71) Applicant: Kabushiki Kaisha Toshiba, Minato-ku (JP)

(72) Inventor: Yuji Setta, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/965,159

(22) Filed: Dec. 10, 2015

Related U.S. Application Data

(60) Provisional application No. 62/204,744, filed on Aug. 13, 2015.

(51) Int. Cl.
*H01L 29/792* (2006.01)
*H01L 27/115* (2006.01)
*H01L 23/00* (2006.01)
*H01L 27/02* (2006.01)
*G06F 17/50* (2006.01)

(52) U.S. Cl.
CPC ..... *H01L 27/11582* (2013.01); *G06F 17/5072* (2013.01); *H01L 23/562* (2013.01); *H01L 27/0248* (2013.01); *H01L 27/11573* (2013.01)

(58) Field of Classification Search
CPC .............. H01L 27/11582; H01L 27/0248; H01L 27/11573; G06F 17/5072
USPC ........................................................ 257/324
See application file for complete search history.

(56) References Cited

U.S. PATENT DOCUMENTS

| | | | |
|---|---|---|---|
| 8,115,245 B2 | 2/2012 | Yoshimizu et al. | |
| 8,546,786 B2 | 10/2013 | Yoshimizu et al. | |
| 8,829,599 B2 * | 9/2014 | Ahn | H01L 29/7926 257/321 |
| 9,099,349 B2 | 8/2015 | Kofuji et al. | |

FOREIGN PATENT DOCUMENTS

| | | |
|---|---|---|
| JP | 2010-80685 | 4/2010 |
| JP | 2014-127475 | 7/2014 |
| JP | 2015-38994 | 2/2015 |

* cited by examiner

*Primary Examiner* — Tu-Tu Ho
(74) *Attorney, Agent, or Firm* — Oblon, McClelland, Maier & Neustadt, L.L.P

(57) ABSTRACT

According to one embodiment, a semiconductor memory device includes a semiconductor substrate, which includes thereon a first region where memory elements are arranged and a second region where circuit elements driving the memory elements are arranged. The first region is provided with a stacked body including a plurality of metal films. Further, the stacked body is divided into a plurality of parts by first separation portions extending in a first direction. The second region is provided with an auxiliary pattern, which includes the stacked body together with a separation portion pair including a pair of second separation portions that divide the stacked body. The second separation portions extend in a second direction intersecting with the first direction.

20 Claims, 18 Drawing Sheets

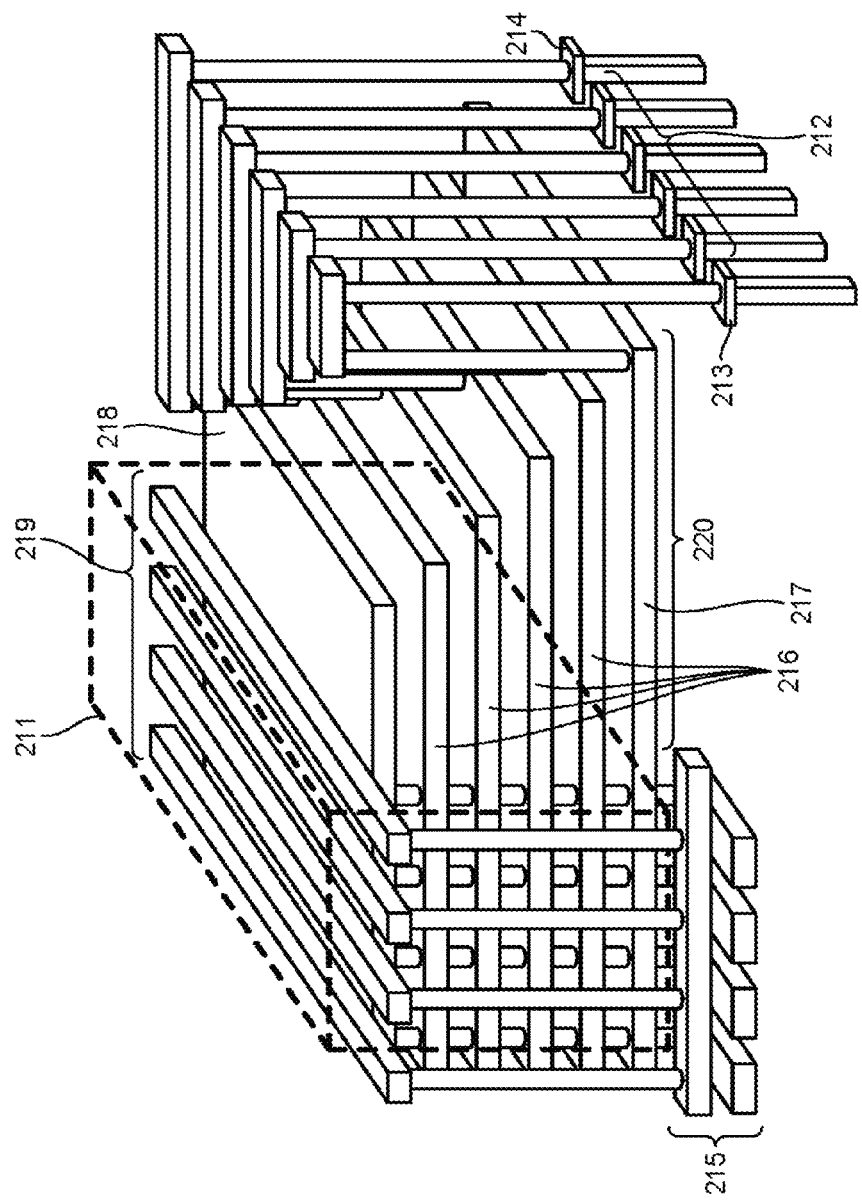

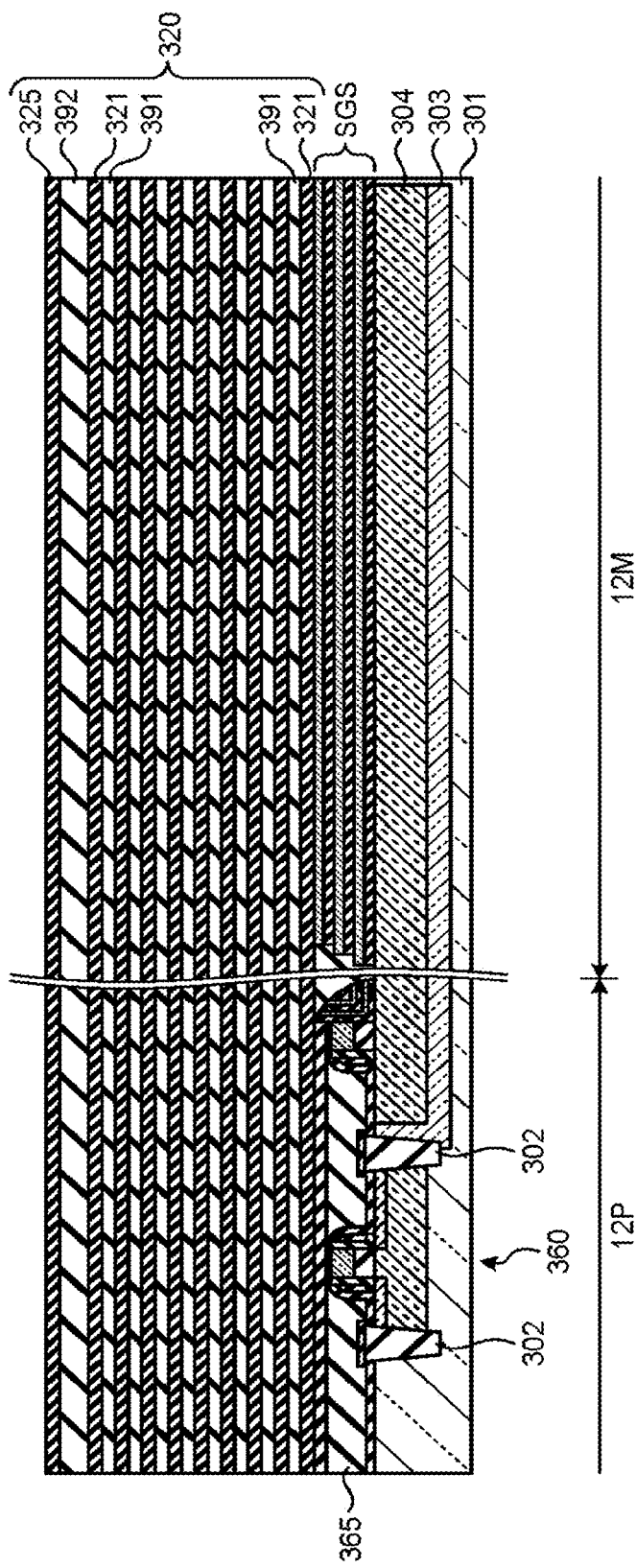

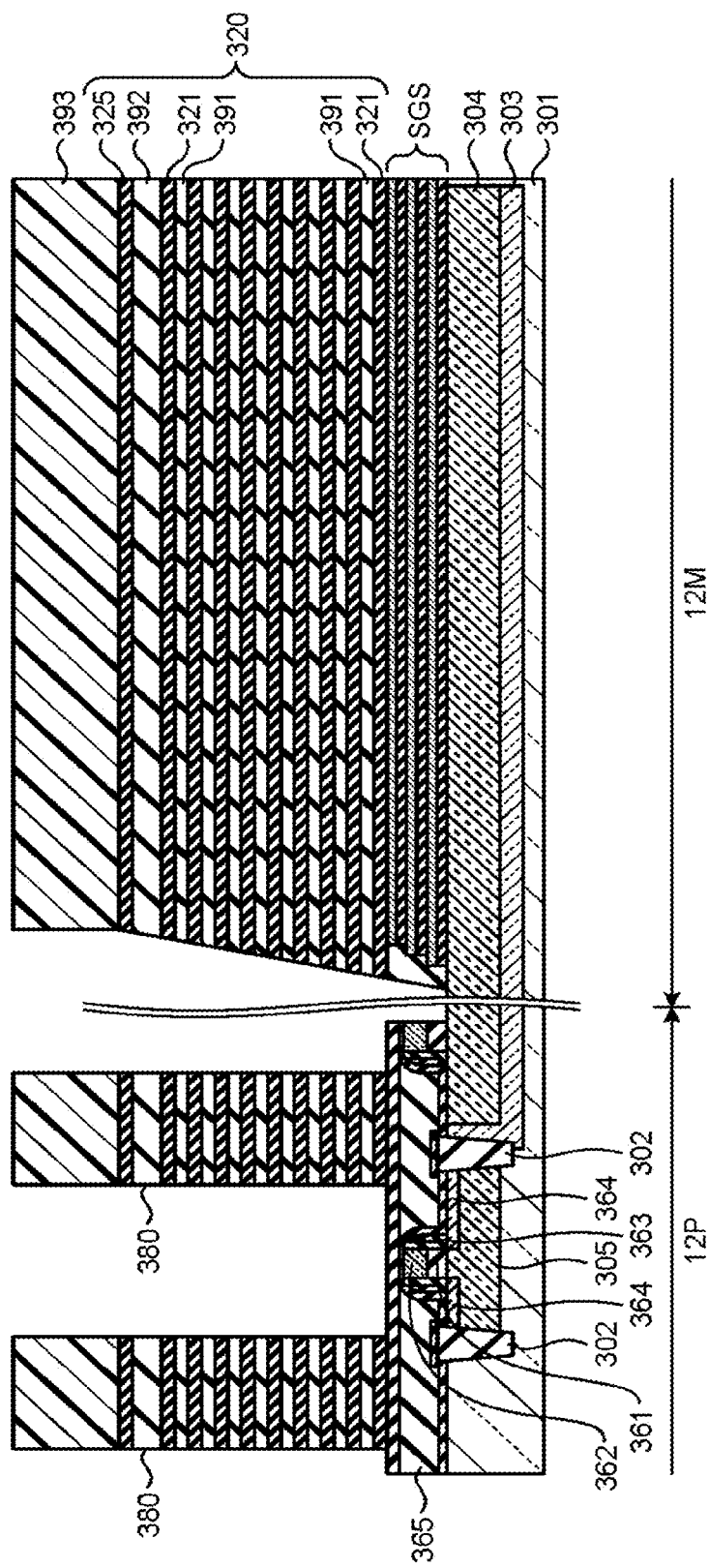

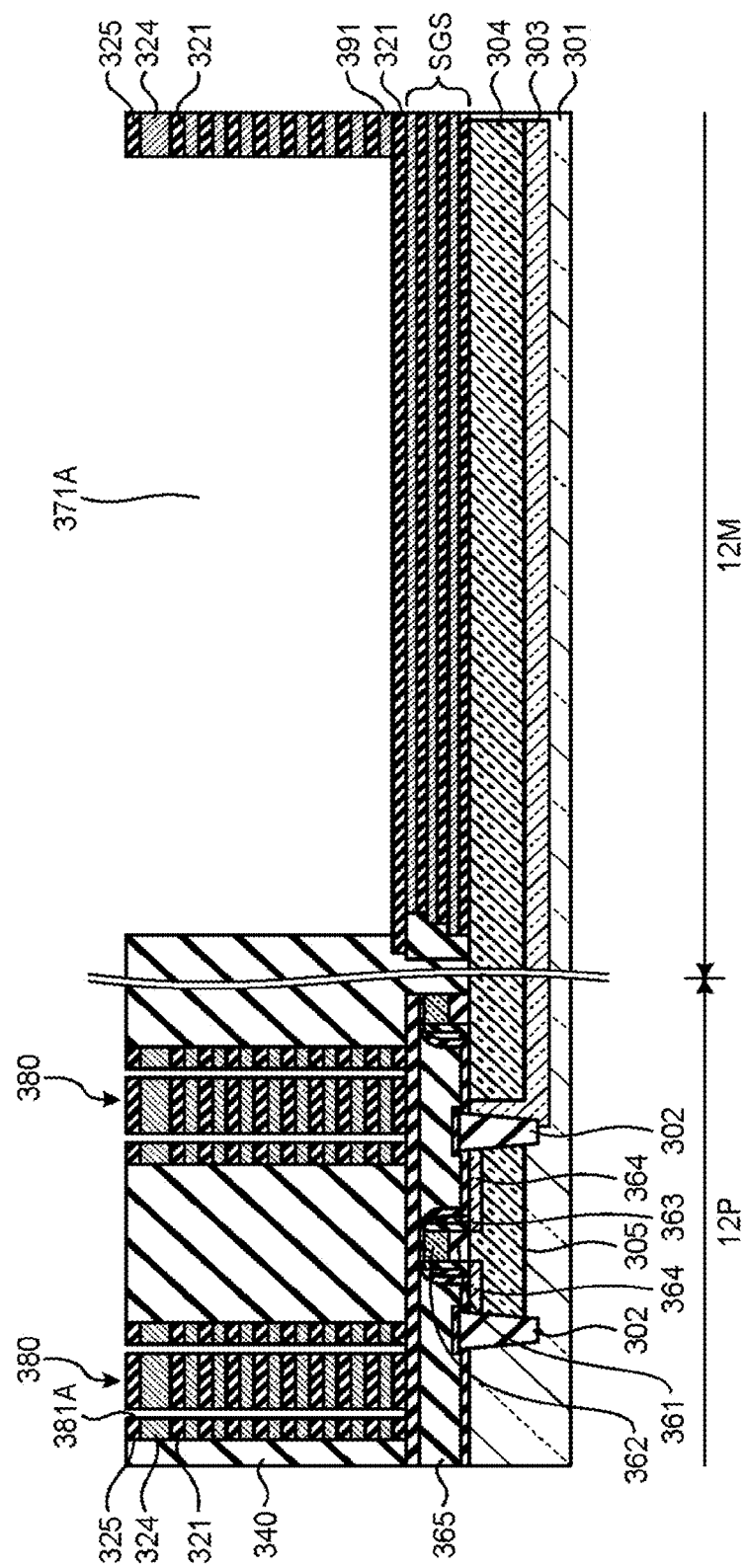

SEMICONDUCTOR MEMORY DEVICE AND METHOD OF MANUFACTURING SEMICONDUCTOR MEMORY DEVICE AND METHOD OF LAYOUTING AUXILIARY PATTERN

CROSS-REFERENCE TO RELATED APPLICATIONS

This application is based upon and claims the benefit of priority from U.S. Provisional Application No. 62/204,744, filed on Aug. 13, 2015; the entire contents of which are incorporated herein by reference.

FIELD

Embodiments described herein relate generally to a semiconductor memory device, a method of manufacturing a semiconductor memory device, and a method of layouting an auxiliary pattern.

BACKGROUND

In NAND type flash memories (each of which will be referred to as a NAND memory, hereinafter) of a planar type, scaling has been advancing to increase the storage density. However, scaling in planar directions has been nearly reaching the limit. In light of this, there is proposed a NAND memory of a three-dimensional type, in which memory elements are arranged in a three-dimensional state. In NAND memories of a three-dimensional type, the memory cell arrangement region has a structure in which a plurality of thin metal films are stacked in an in-plane direction of a semiconductor wafer, but the peripheral circuit arrangement region has a structure in which these thin metal films are not present. In other words, a NAND memory of a three-dimensional type has cross sectional structures different from each other between the memory cell arrangement region and the peripheral circuit arrangement region. Consequently, the film stress generated by the memory cell arrangement region where the thin metal films are concentrated becomes dominant, and the semiconductor wafer is thereby warped in a specific direction depending on the arrangement direction of the layout of the thin metal films.

BRIEF DESCRIPTION OF THE DRAWINGS

FIG. 2 is a perspective view schematically showing an example of the structure of the semiconductor memory device;

FIGS. 11A to 11F are sectional views schematically showing an example of the sequence of a method of manufacturing a semiconductor memory device according to the embodiment.

DETAILED DESCRIPTION

In general, according to one embodiment, a semiconductor memory device includes a semiconductor substrate, which includes thereon a first region where memory elements are arranged and a second region where circuit elements driving the memory elements are arranged. The first region is provided with a stacked body including a plurality of metal films. Further, the stacked body is divided into a plurality of parts by first separation portions extending in a first direction. The second region is provided with an auxiliary pattern, which includes the stacked body together with a separation portion pair including a pair of second separation portions that divide the stacked body. The second separation portions extend in a second direction intersecting with the first direction.

An exemplary embodiment of a semiconductor memory device, a method of manufacturing a semiconductor memory device, and a method of layouting an auxiliary pattern will be explained below in detail with reference to the accompanying drawings. The present invention is not limited to the following embodiment. The sectional views, the top views, and the perspective view of a semiconductor memory device used in the following embodiment are schematic, and so the relationship between the thickness and width of each layer and/or the thickness ratios between respective layers may be different from actual states. Further, hereinafter, the semiconductor memory device will be exemplified by a NAND memory of a three-dimensional type, which is a nonvolatile semiconductor memory device.

Figure 1:
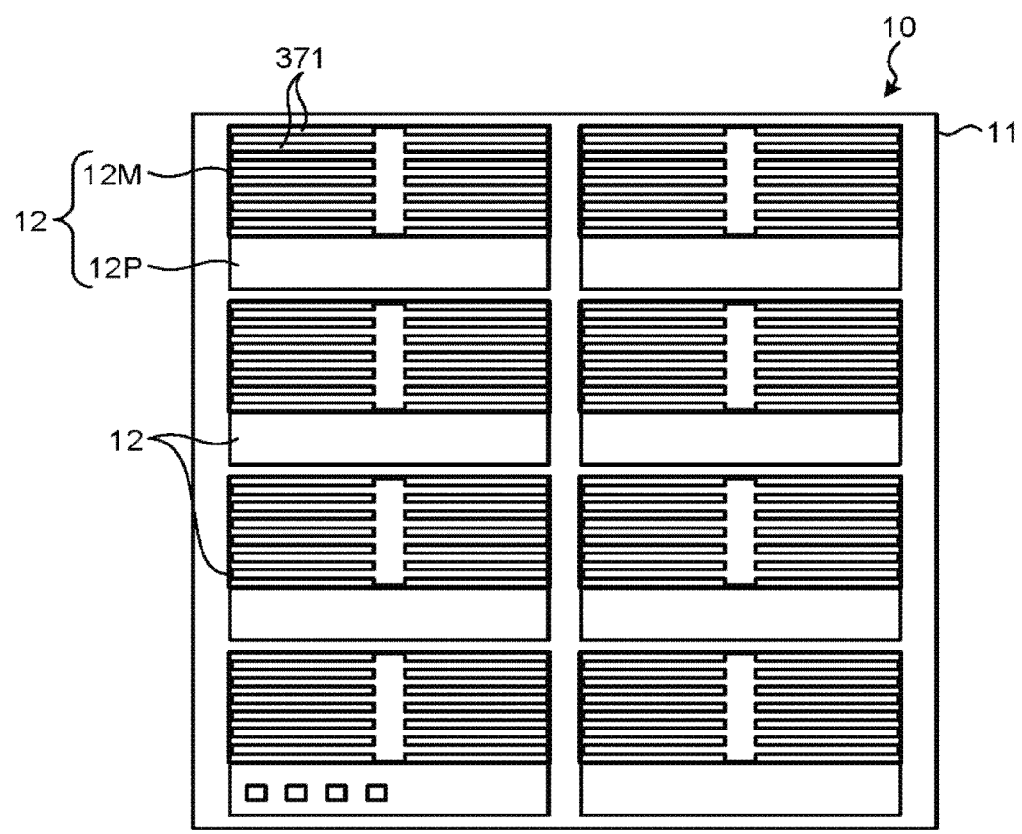
FIG. 1 is a plan view schematically showing an example of the layout of chips in a semiconductor memory device.

FIG. 1 is a plan view schematically showing an example of the layout of chips in a semiconductor memory device. The semiconductor memory device 10 has a structure in which a plurality of chips 12 are arranged in a two-dimensional state on a substrate 11, such as a semiconductor wafer. Each chip 12 includes a memory cell arrangement region 12M where NAND memories are arranged in a three-dimensional state, and a peripheral circuit arrangement region 12P where circuit elements and so forth for driving memory cells are arranged. The memory cell arrangement region 12M is provided with separation portions 371 that divide electrode films in a predetermined direction. The separation portions 371 divide the electrode films to form word lines.

FIG. 2 is a perspective view schematically showing an example of the structure of the semiconductor memory device. The semiconductor memory device includes a memory cell part 211, a word line drive circuit 212, a source-side selection gate line drive circuit 213, a drain-side selection gate line drive circuit 214, a sense amplifier 215, word lines 216, a source-side selection gate line 217, a drain-side selection gate line 218, and bit lines 219.

The memory cell part 211 is configured such that a plurality of memory strings are arranged on the substrate, in which each memory string includes a plurality of memory cell transistors (each of which will also be simply referred to as a memory cell, hereinafter) together with a drain-side selection transistor and a source-side selection transistor respectively provided at the upper and lower ends of a memory cell column. As described later, each of the memory cell transistors, the drain-side selection transistor, and the source-side selection transistor is structured such that a gate electrode is formed on the side surface of a hollow columnar structure body including a semiconductor film, a tunnel insulating film, a charge accumulation film, and an interelectrode insulating film stacked in this order. In each memory cell transistor, the gate electrode serves as a control gate electrode, and, in each of the drain-side selection transistor and the source-side selection transistor, the gate electrode serves as a selection gate electrode. The structure shown in FIG. 2 is exemplified by a case where one memory string is provided with memory cells in four layers.

Each word line 216 connects the control gate electrodes of memory cells at the same height to each other among memory strings present within a predetermined range. The direction in which the word lines 216 extend will be referred to as a word line direction, hereinafter. Further, the source-side selection gate line 217 connects the selection gate electrodes of source-side selection transistors to each other among the memory strings present within the predetermined range, and the drain-side selection gate line 218 connects the selection gate electrodes of drain-side selection transistors to each other among the memory strings present within the predetermined range. Further, the bit lines 219 are arranged such that they are respectively connected to the upper sides of the memory strings in a direction intersecting with the word line direction (in this example, in a direction perpendicular thereto). The direction in which the bit lines 219 extend will be referred to as a bit line direction, hereinafter.

The word line drive circuit 212 is a circuit for controlling voltage to be applied to the word lines 216, the source-side selection gate line drive circuit 213 is a circuit for controlling voltage to be applied to the source-side selection gate line 217, and the drain-side selection gate line drive circuit 214 is a circuit for controlling voltage to be applied to the drain-side selection gate line 218. Further, the sense amplifier 215 is a circuit for amplifying an electric potential read from a selected memory cell. Here, in the following explanation, when there is no need to distinguish the source-side selection gate line 217 and the drain-side selection gate line 218 from each other, they will be simply referred to as selection gate lines. Further, when there is no need to distinguish the source-side selection transistor and the drain-side selection transistor from each other, they will be simply referred to as selection transistors.

The word lines 216, the source-side selection gate line 217, and the drain-side selection gate line 218 provided in the memory cell part 211 are connected to the word line drive circuit 212, the source-side selection gate line drive circuit 213, and the drain-side selection gate line drive circuit 214 respectively through contacts in a word line contact part 220 (electrode line contact part) provided for the memory cell part 211. The word line contact part 220 is arranged on a side of the memory cell part 211 facing the word line drive circuit 212, and has a structure formed such that the word lines 216 and the selection gate lines 217 and 218, which are connected to the memory cells at respective heights and the selection transistors, have been processed in a stepwise state.

Figure 3A:
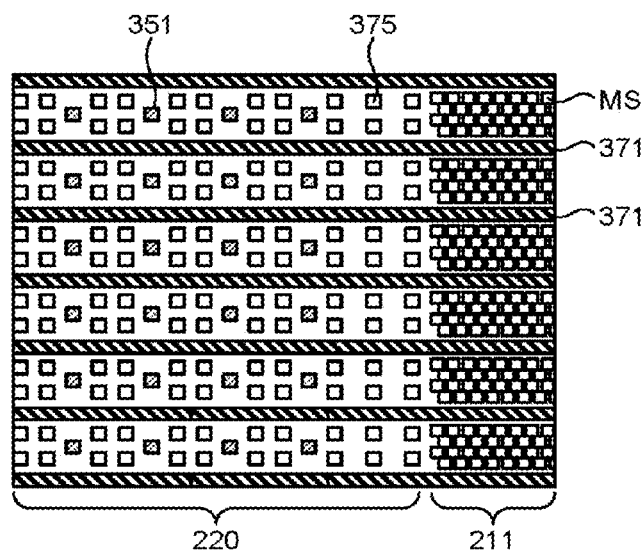
FIG. 3A is a top view schematically showing an example of the configuration of a memory cell part and a word line contact part.
Figure 3B:
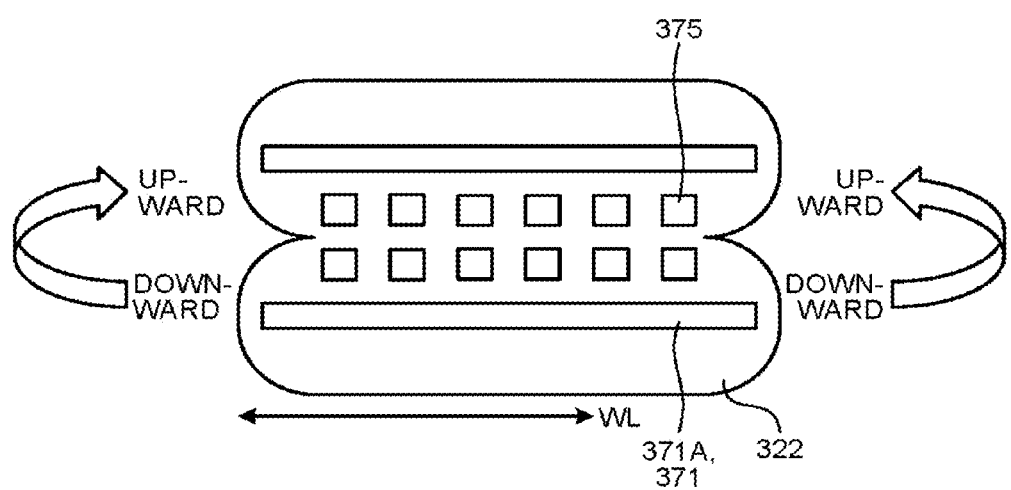
FIG. 3B is a view for explaining deformation of the memory cell part.

FIG. 3A is a top view schematically showing an example of the configuration of the memory cell part and the word line contact part. FIG. 3B is a view for explaining deformation of the memory cell part. As shown in FIG. 3A, the memory cell part 211 is provided with the separation portions 371, which are arranged in parallel with the word line direction and at predetermined intervals in the bit line direction. The semiconductor memory device shown in FIG. 2 is formed by use of the areas between the separation portions 371.

The memory cell part 211 includes a plurality of memory strings MS. The word line contact part 220 includes word line contacts 351 and further includes beam portions 375 that penetrate the stacked body constituting the memory cell part 211, in the thickness direction. The beam portions 375 serve as supports in a process of manufacturing the semiconductor memory device described later, in relation to a stacked body including sacrificial films and spacer films alternately stacked, such that they support the spacer films to maintain gaps generated by removing the sacrificial films.

The separation portions 371 extend in the word line direction, and are respectively formed of insulating films or the like embedded in slits 371A that penetrate the stacked body in the thickness direction. The slits 371A serve as windows, in the process of manufacturing the semiconductor memory device described later, such that, when electrode films 322 are formed in the gaps generated by removing the sacrificial films, a material for forming the electrode films 322 can move in and out through the windows. As shown in FIG. 3B, the electrode films 322 are formed through the slits 371A all over the memory cell part 211 and the word line contact part 220. Further, the electrode films 322 are divided by the slits 371A to cut conduction between adjacent parts of the electrode films 322 sandwiching each slit 371A. Accordingly, the electrode films 322 have shapes extending in the word line direction. As a result, the electrode films 322 lose the stress balance relative to the spacer films, and the electrode films 322, or the semiconductor wafer, is thereby warped upward, at the opposite ends of the electrode films 322 in the extending direction.

Figure 4:
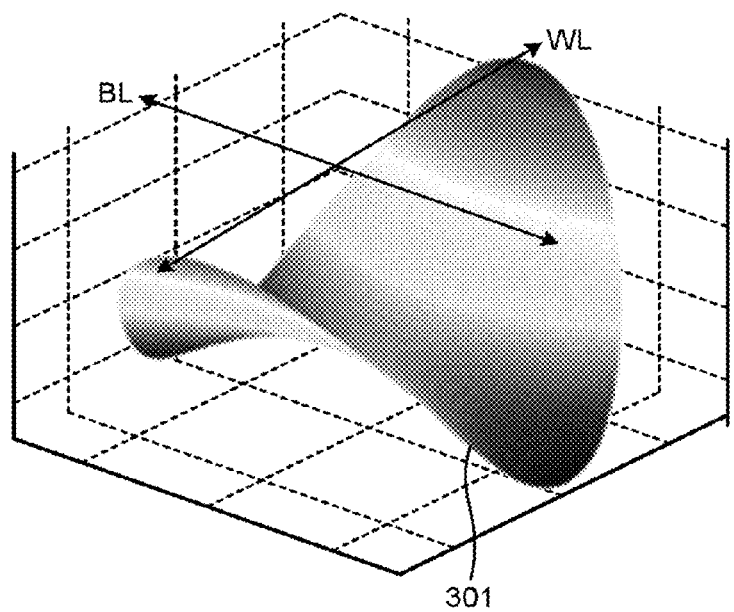
FIG. 4 is a view schematically showing an example of a warped shape of a semiconductor wafer.

FIG. 4 is a view schematically showing an example of a warped shape of a semiconductor wafer. As shown in FIG. 4, the semiconductor wafer comes to have a saddle shape in which the opposite ends in the word line (WL) direction are raised upward.

As described above, in the case of a semiconductor memory device of a three-dimensional type, the semiconductor wafer 301 ends up being deformed into a saddle shape. Accordingly, in an embodiment described hereinafter, an explanation will be given of a semiconductor memory device and a method of manufacturing the same, which can suppress the semiconductor wafer from being deformed into a saddle shape.

Figure 5:
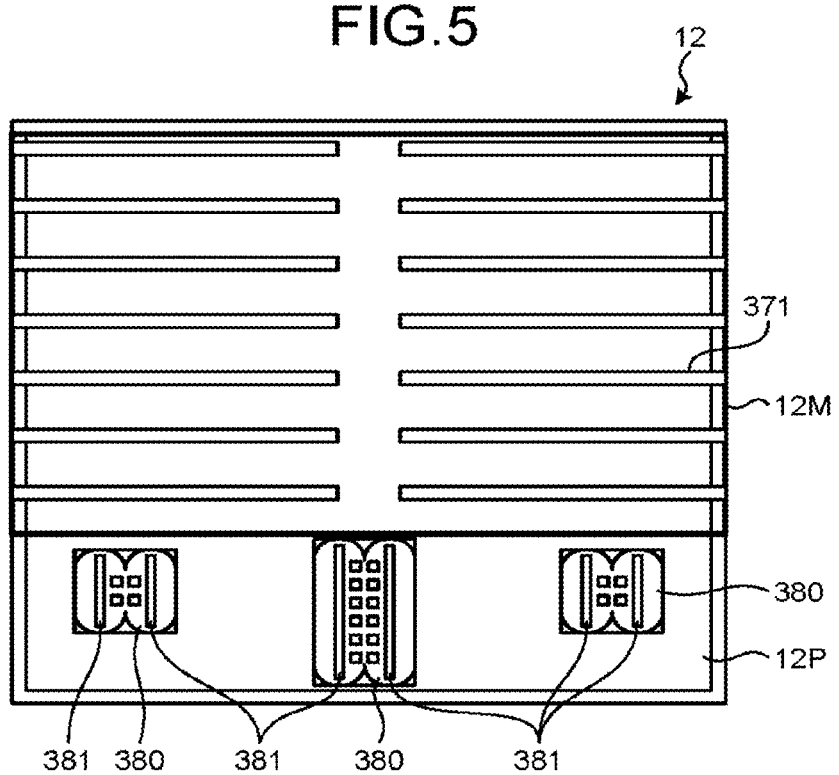
FIG. 5 is a top view schematically showing an example of the layout in a chip according to an embodiment.

FIG. 5 is a top view schematically showing an example of the layout in a chip according to an embodiment. Each chip 12 includes the memory cell arrangement region 12M and the peripheral circuit arrangement region 12P, as described above. In the memory cell arrangement region 12M, electrode films are divided by separation portions 371 into word lines. As a result, as shown in FIGS. 3B and 4, the thin metal films forming the word lines can be more easily deformed in the lengthwise direction (word line direction) than in the widthwise direction. Accordingly, in this embodiment, the peripheral circuit arrangement region 12P is provided with a stacked body the same as the stacked body provided in the memory cell arrangement region 12M, and this stacked body is formed with auxiliary patterns 380 each including separation portions 381 extending in a direction intersecting with the word line direction.

Each auxiliary pattern 380 is arranged in a region where no circuit element is present inside the peripheral circuit arrangement region 12P. Further, the separation portions 381 of the auxiliary patterns 380 are preferably set to extend in a direction having an angle larger than 45° relative to the word line direction. If the angle is not larger than 45° relative to the word line direction, the components contributing to deformation in the word line direction become larger than the components contributing to deformation in a direction perpendicular to the word line direction. Accordingly, the separation portions 381 of the auxiliary patterns 380 are preferably set to intersect with the word line direction by an angle larger than 45°, with which the components contributing to deformation in the word line direction become larger than the components contributing to deformation in the word line extending direction. Further, if the separation portions 381 intersect with the word line direction by an angle of 90°, there becomes no component contributing to deformation in the word line direction. Accordingly, the separation portions 381 are preferably set to intersect with the word line direction by an angle of 90°.

Figure 6:
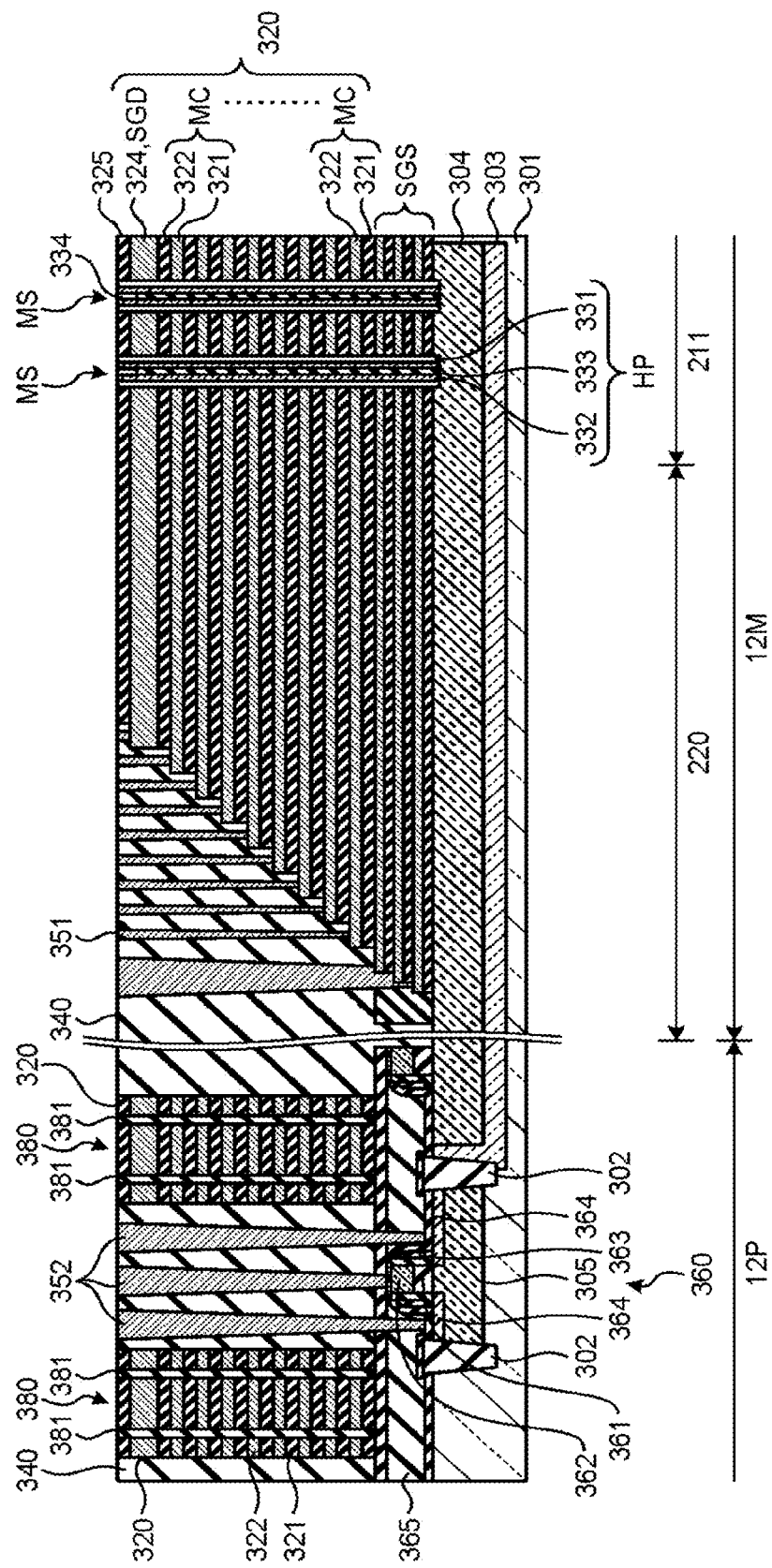
FIG. 6 is a sectional view schematically showing an example of a partial configuration of a memory cell arrangement region and peripheral circuit arrangement region in the semiconductor memory device according to the embodiment.

FIG. 6 is a sectional view schematically showing an example of a partial configuration of the memory cell arrangement region and peripheral circuit arrangement region in the semiconductor memory device according to the embodiment. The memory cell arrangement region 12M is provided with the memory cell part 211 and the word line contact part 220.

The memory cell part 211 includes memory strings MS formed almost vertically and arranged in a two-dimensional state on the semiconductor wafer 301. Each memory string MS has a configuration in which a plurality of transistors are connected in series. Each memory string MS includes a pillar member HP of a columnar structure body, and electrode films 322. The pillar member HP has a structure in which an ONO film 331 having a hollow columnar shape is stacked on the outer peripheral surface of a semiconductor film 332 having a hollow columnar shape, and the ONO film 331 is composed of a tunnel insulating film, a charge accumulation film, and an inter-electrode insulating film. The hollow columnar semiconductor film 332 serves as the channels of transistors constituting the memory string MS. The semiconductor film 332 may be formed of a poly-silicon film prepared by, e.g., annealing amorphous silicon. A plurality of electrode films 322 are arranged with spacer films 321 respectively interposed therebetween in the height direction of the pillar member HP.

Here, a filler insulating film 333, such as a silicon oxide film, is embedded in the hollow columnar semiconductor film 332 up to a predetermined height, and a cap film 334, such as a P-type amorphous silicon film, is further embedded thereon from the predetermined height.

In the column of the transistors connected in series in the height direction, the transistors at the upper and lower ends serve as selection transistors SGS and SGD. In the example shown in FIG. 6, the source-side selection transistor SGS, whose gate electrode is formed of four electrode films 322 respectively stacked with spacer films 321 interposed therebetween, is arranged on the lower side, and the drain-side selection transistor SGD, whose gate electrode is formed of an electrode film 324, is arranged on the upper side. Between these two selection transistors SGS and SGD, one or more memory cell transistors MC are arranged at predetermined intervals. In this example, the selection transistors SGS and SGD have the same structure as the structure of the memory cell transistors MC.

As shown in FIGS. 3A and 5, the memory cell part 211 and the word line contact part 220 are divided into a plurality of regions by the separation portions 371 that extend in the word line direction. Each separation portion 371 has a configuration in which an insulating film, such as a silicon oxide film, is embedded in a slit that penetrates a memory layer formation body 320 in the thickness direction. The memory layer formation body 320 is formed of a stacked body including the plurality of spacer films 321 and electrode films 322 together with the electrode film 324 and an insulating film 325.

The transistors at the same height in each of the regions between the separation portions 371 are connected to each other by the same electrode film 322. For example, the source-side selection transistors SGS in each of the regions between the separation portions 371 are connected to each other by the lowermost layer electrode film. The drain-side selection transistors SGD in each of the regions between the separation portions 371 are connected to each other by the electrode film 324. These electrode films serve as selection gate lines.

Further, the memory cells MC at the same height in each of the regions between the separation portions 371 are connected to each other by the corresponding one of the electrode films 322. Each electrode film 322 connecting the memory cells MC serves as a word line.

In the word line contact part 220, the electrode films 322 and 324 extending from the memory cell part 211 are arranged in a stacked state. The electrode films 322 and 324 form a stepwise configuration, such that the electrode films 322 on their lower sides are respectively exposed. The word line contact part 220 also has a structure in which the spacer films 321 are respectively interposed between the electrode films 322 vertically adjacent to each other.

In the word line contact part 220, a planarization film 340 is provided on the electrode films 322 and 324 arranged in a stepwise state. The planarization film 340 may be formed of a silicon oxide film, for example. The word line contacts 351 are formed in the planarization film 340 and are respectively connected to the electrode films 322 and 324 arranged in a stepwise state. The word line contacts 351 may be made of tungsten (W), aluminum (Al), or copper (Cu), for example.

In the region for forming the memory cell part 211 and the word line contact part 220, an N-type well 303 is formed near the upper side of the semiconductor wafer 301, and a P-type well 304 is further formed in the N-type well 303.

The peripheral circuit arrangement region 12P includes peripheral circuit elements. In the example shown in FIG. 6, a peripheral transistor 360 formed of a field effect transistor is shown as being arranged as a peripheral circuit element. Element isolation insulating films 302 are formed from the upper surface of the semiconductor wafer 301 and extend to a predetermined depth. Each element isolation insulating film 302 is formed of a silicon oxide film, for example. In each of the regions partitioned by the element isolation insulating films 302, a P-type well 305 is formed. The peripheral transistor 360 is provided on the P-type well 305.

The peripheral transistor 360 has a structure in which a gate electrode 362 having a predetermined shape is arranged through a gate insulating film 361 on the P-type well 305. A stacked body composed of the gate insulating film 361 and the gate electrode 362 is provided with sidewall films 363 on its opposite side surfaces in the gate length direction. In the upper surface of the semiconductor wafer 301, source/drain regions 364 are respectively formed on the opposite sides in the gate length direction of the gate electrode 362. In this example, the source/drain regions 364 are formed of N-type diffusion layers.

The peripheral circuit arrangement region 12P is provided with an interlayer insulating film 365 that covers the peripheral circuit elements, such as the peripheral transistor 360. The interlayer insulating film 365 has a thickness to define almost the same height as that of the stacked films constituting the source-side selection transistor SGS, which are composed of spacer films and electrode films, in the memory cell part 211.

The planarization film 340 is present in a region above the interlayer insulating film 365, which corresponds to the peripheral circuit elements. Contacts 352 are formed in the planarization film 340 and are respectively connected to the electrode portions of the peripheral circuit elements. Further, the auxiliary patterns 380 are arranged in regions above the interlayer insulating film 365, which are separated by a predetermined distance from the positions of the contacts 352 or the like, where electric connection is unacceptable. As described above, the auxiliary patterns 380 are formed from the memory layer formation body 320. Further, these regions are provided with the separation portions 381 in a direction intersecting with the separation portions 371 formed in the memory cell part 211 and the word line contact part 220.

Further, although not shown, the memory cell arrangement region 12M and the peripheral circuit arrangement region 12P are provided with interlayer insulating films and wiring layers thereon, such that the wiring layers are connected to the word line contacts 351 and the contacts 352.

Figure 7A:
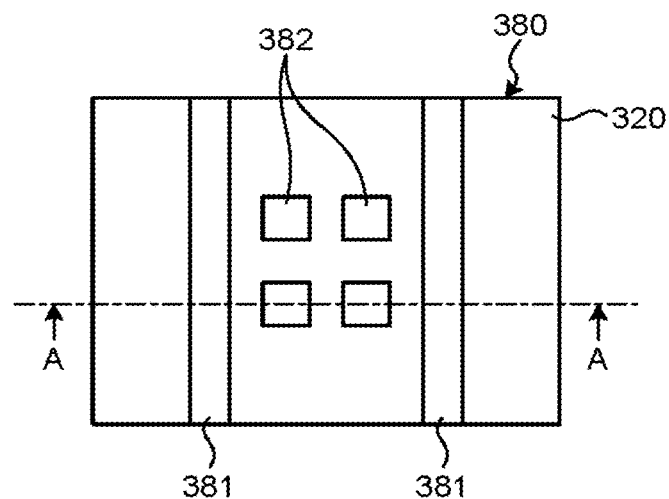
FIGS. 7A to 7C are views showing an example of an auxiliary pattern according to the embodiment.
Figure 7B:
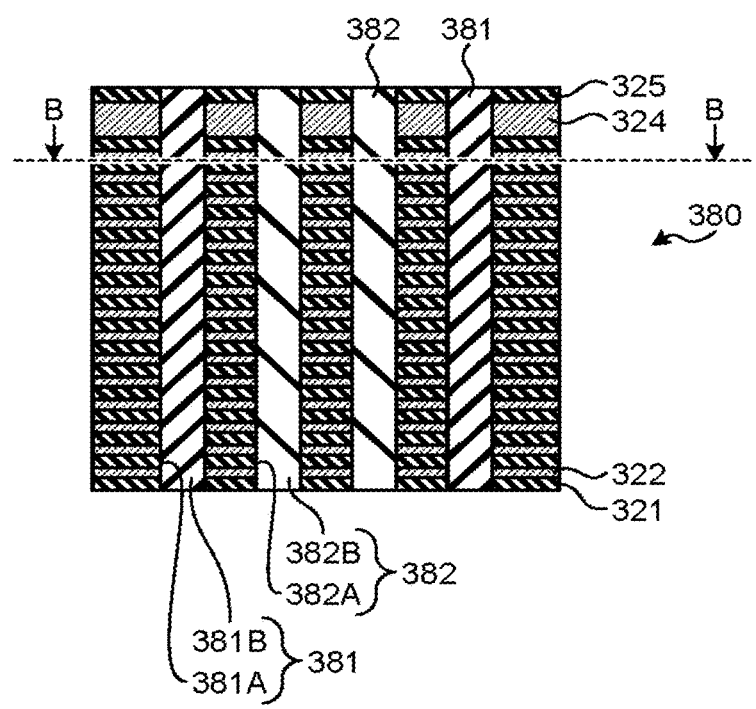
Figure 7C:
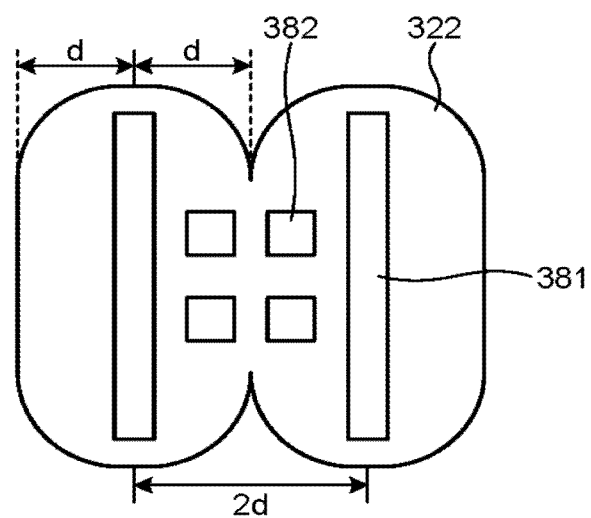

FIGS. 7A to 7C are views showing an example of an auxiliary pattern according to the embodiment. FIG. 7A is a top view of the auxiliary pattern, FIG. 7B is a sectional view taken along line A-A of FIG. 7A, and FIG. 7C is a sectional view taken along line B-B of FIG. 7B. This auxiliary pattern 380 includes a memory layer formation body 320, separation portions 381, and beam portions 382. The memory layer formation body 320 includes a stacked body formed of a plurality of spacer films 321 and a plurality of electrode films 322 alternately stacked, by which memory cells are formed in the memory cell arrangement region 12M, and further includes an electrode film 324 and an insulating film 325.

Each separation portion 381 has a structure in which a filler film 381B, such as an insulating film, is embedded in a slit 381A that penetrates the memory layer formation body 320 in the thickness direction. As described above, the extending direction of the separation portions 381 is set to form a predetermined angle with the extending direction of the separation portions 371 in the memory cell arrangement region 12M. Each beam portion 382 has a structure in which an insulating film 382B, such as a silicon oxide film, is embedded in a hole 382A that penetrates the memory layer formation body 320 in the thickness direction. The beam portions 382 serve to support the spacer films 321 when gaps are generated by removing the sacrificial films present between the spacer films 321 in a manufacturing process described later.

The distance between adjacent slits 381A is preferably set to 2d or less, where "d" denotes a permeating distance of a material in the process of replacement with the material through the slits 381A. Further, the width of each slit 381A is preferably set to be a width that does not interfere with the beam portions 382. As shown in FIG. 7C, when the electrode films 322 are embedded through the slits 381A, the electrode films 322 are filled into the gaps between the spacer films 321 adjacent to each other in the stacked direction, while avoiding the beam portions 382.

Figure 8:
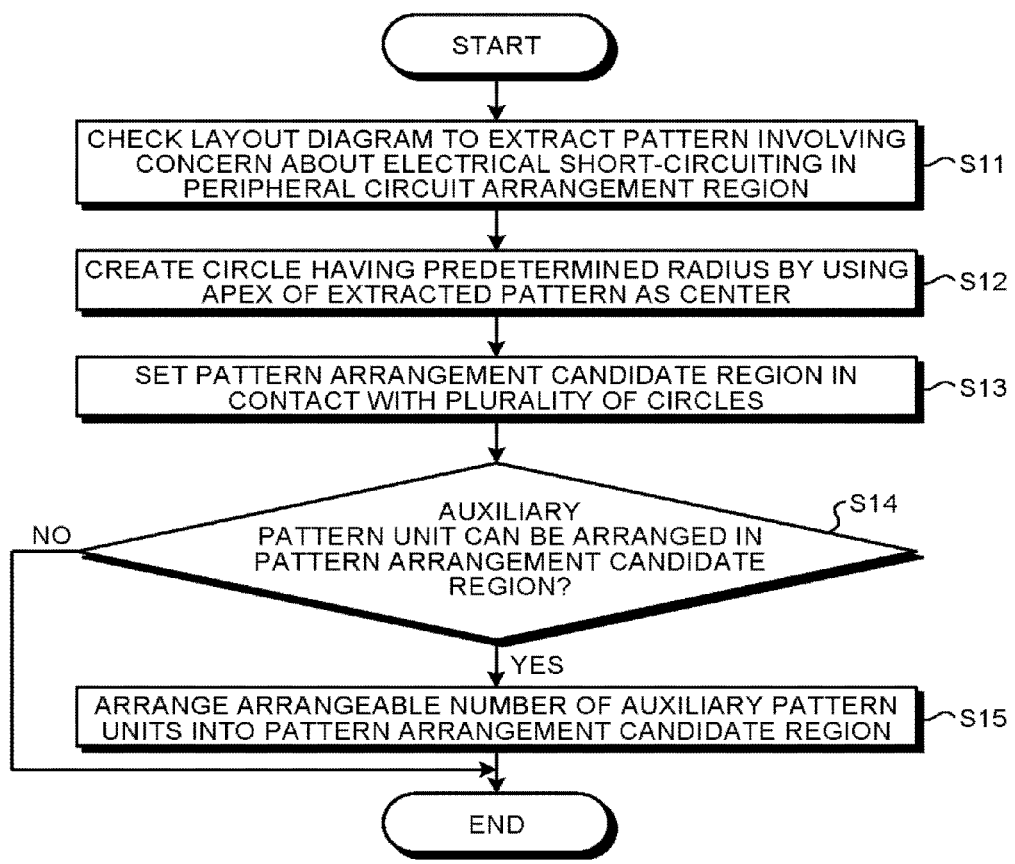
FIG. 8 is a flow chart showing an example of the sequence of a method of layouting an auxiliary pattern according to the embodiment.
Figure 9A:
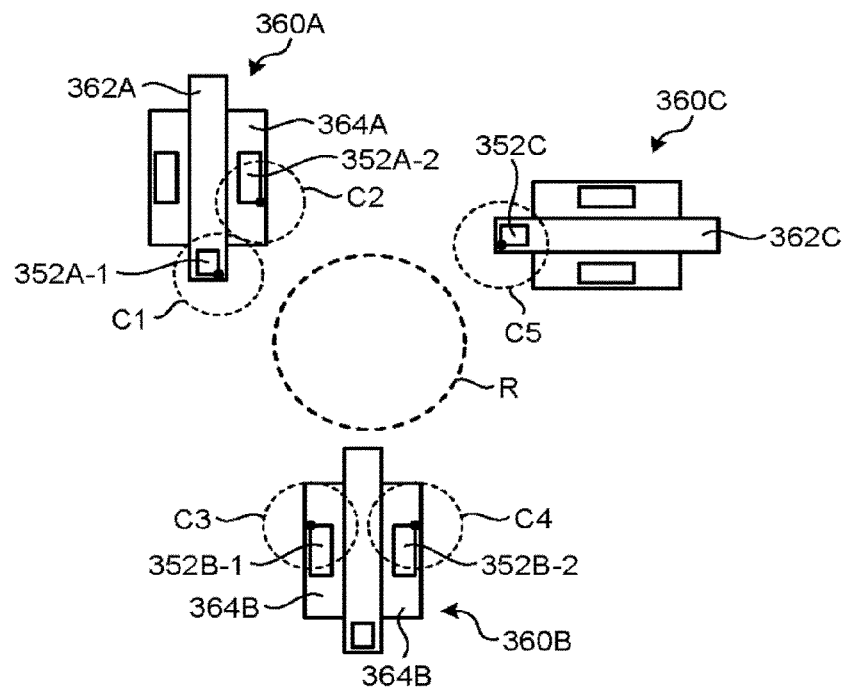
FIGS. 9A to 9C are top views schematically showing an example of the sequence of a process of arranging an auxiliary pattern in the peripheral circuit arrangement region.
Figure 9B:
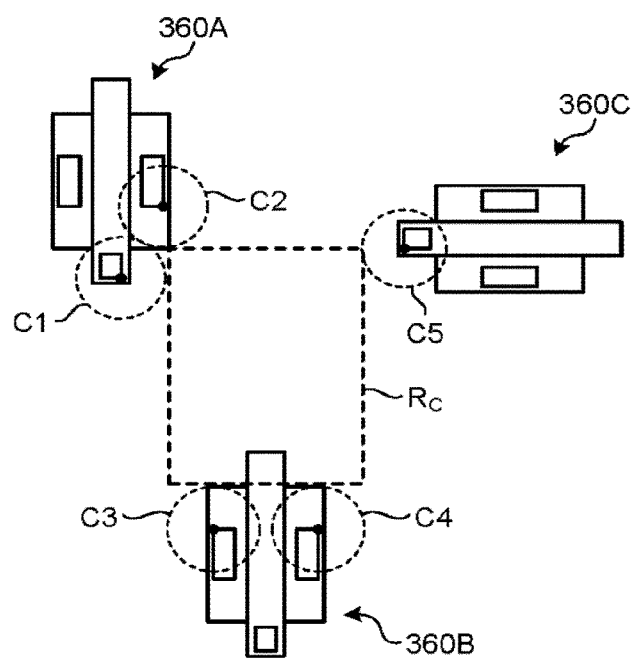
Figure 9C:
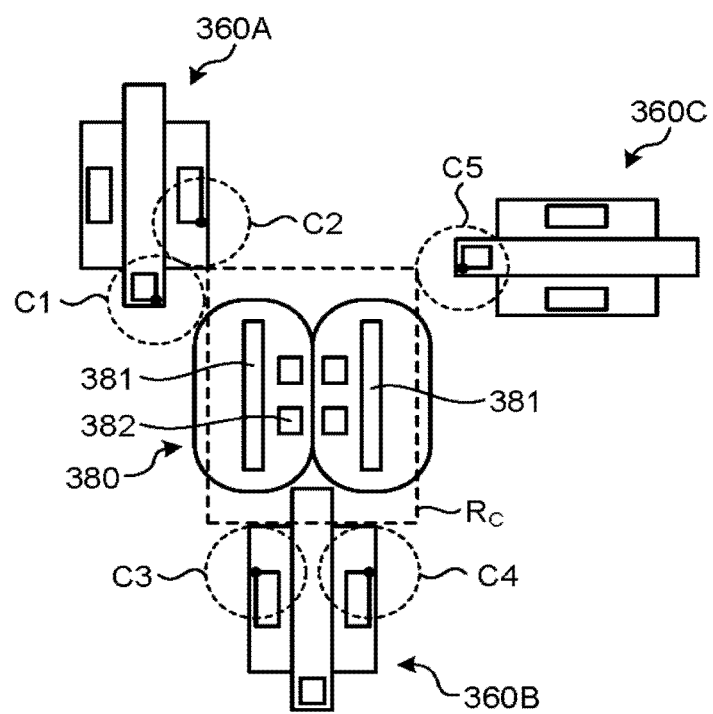

Next, an explanation will be given of a method of layouting an auxiliary pattern 380. FIG. 8 is a flow chart showing an example of the sequence of a method of layouting an auxiliary pattern according to the embodiment. Further, FIGS. 9A to 9C are top views schematically showing an example of the sequence of a process of arranging an auxiliary pattern in the peripheral circuit arrangement region. Here, it is assumed that an apparatus for executing the layouting method is in a state where a layout diagram including the memory cell arrangement region 12M and the peripheral circuit arrangement region 12P has already been read into the apparatus.

At first, the layout diagram is checked to extract a pattern involving a concern about electrical short-circuiting in the peripheral circuit arrangement region 12P (step S11). The pattern involving a concern about electrical short-circuiting may be exemplified by the diffusion layers (source/drain regions 364), the gate electrode 362, and the contacts 352, provided at each peripheral transistor 360.

Then, with respect to the apex of the extracted pattern, a circle having a predetermined radius is created by using this apex as the center (step S12). For example, as shown in FIG. 9A, it is assumed that there are three peripheral transistors 360A to 360C in the peripheral circuit arrangement region of the layout diagram. Further, it is assumed that there is no elemental device present inside a region R surrounded by these three peripheral transistors 360A to 360C. Under these assumptions, in relation to each of the peripheral transistors 360A to 360C, a pattern involving a concern about electrical short-circuiting is extracted near the region R. For example, at the peripheral transistor 360A, circles C1 and C2 are created on its gate line contact 352A-1 and diffusion layer contact 352A-2. The gate line contact 352A-1 is connected to its gate electrode 362A. The diffusion layer contact 352A-2 is connected to one of its source/drain regions 364A. At the peripheral transistor 360B, circles C3 and C4 are created on its two diffusion layer contacts 352B-1 and 352B-2. The diffusion layer contacts 352B-1 and 352B-2 are connected to its source/drain regions 364B. At the peripheral transistor 360C, a circle C5 is created on its gate line contact 352C. The gate line contact 352C is connected to its gate electrode 362C.

Thereafter, a pattern arrangement candidate region $R_C$ is set such that it is in contact with the plurality of circles C1 to C5 thus created (step S13). For example, as shown in FIG. 9B, a rectangle in contact with these created circles C1 to C5 is created, and this rectangle is considered as a pattern arrangement candidate region $R_C$. Here, the pattern arrangement candidate region $R_C$ is rectangle in this example, but the pattern arrangement candidate region $R_C$ may be created as a pattern having a projected shape, recessed shape, or another polygonal shape, in a case that peripheral transistors are arranged more plural.

Then, a judgment is made as to whether an auxiliary pattern unit can be arranged in the pattern arrangement candidate region $R_C$ (step S14). The auxiliary pattern unit is a unit having a smallest size as the auxiliary pattern 380. For example, this auxiliary pattern unit has a configuration including a pair of separation portions 381 (slits 381A) set in parallel with each other and a pair of beam portions 382 arranged between the pair of separation portions 381. If the pattern arrangement candidate region $R_C$ can accommodate at least one auxiliary pattern unit, it is judged that the auxiliary pattern unit can be arranged in the pattern arrangement candidate region $R_C$. On the other hand, if the pattern arrangement candidate region $R_C$ cannot accommodate even one auxiliary pattern unit, it is judged that the auxiliary pattern unit cannot be arranged in the pattern arrangement candidate region $R_C$. In this respect, when this judgment is made, the direction of the separation portions 381 of the auxiliary pattern unit is set to a direction intersecting with the extending direction of the separation portions 371 (word lines) in the memory cell arrangement region 12M, and is set preferably to a direction intersecting by an angle larger than 45°, and more preferably to a direction intersecting by an angle of 90°.

When the auxiliary pattern unit cannot be arranged in the pattern arrangement candidate region $R_C$ (No in step S14), the process sequence ends because the auxiliary pattern 380 cannot be arranged.

When the auxiliary pattern unit can be arranged in the pattern arrangement candidate region $R_C$ (Yes in step S14), an arrangeable number of auxiliary pattern units are arranged into the pattern arrangement candidate region $R_C$ (step S15). For example, as shown in FIG. 9C, the pattern arrangement candidate region $R_C$ can accommodate two auxiliary pattern units in the extending direction of the separation portions 381. Accordingly, an auxiliary pattern 380 composed of two auxiliary pattern units connected to each other in the extending direction of the separation portions 381 is arranged. More specifically, two pairs of beam portions 382 are arranged between a pair of separation portions 381 set in parallel with each other. The pattern arrangement candidate region $R_C$ including the auxiliary pattern 380 thus arranged is an auxiliary pattern arrangement region. Here, the auxiliary pattern units are connected in the extending direction of the separation portions 381 in this example, but auxiliary pattern units may be arranged in parallel in a direction perpendicular to the extending direction of the separation portions 381, depending on the shape of the pattern arrangement candidate region $R_C$. In the way described above, the layout diagram of the peripheral circuit arrangement region 12P is changed, and so the process sequence ends. Then, in accordance with this layout diagram, a semiconductor memory device is manufactured.

Figure 10:
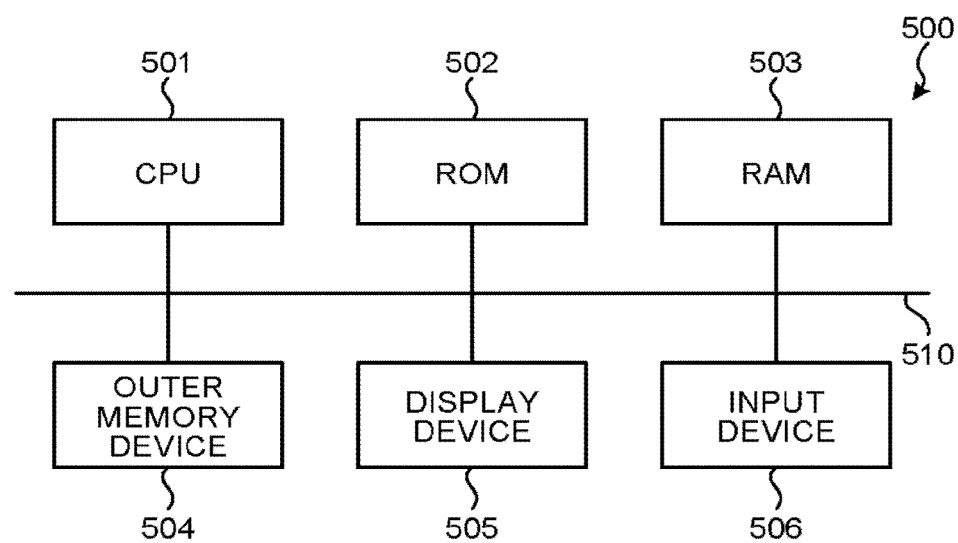
FIG. 10 is a block diagram schematically showing an example of the configuration of an information processing apparatus.

The method of layouting an auxiliary pattern 380 described above can be executed by an information processing apparatus, such as a personal computer. FIG. 10 is a block diagram schematically showing an example of the configuration of an information processing apparatus. This information processing apparatus 500 has a configuration in which a CPU (Central Processing Unit) 501, a ROM (Read Only Memory) 502, a RAM (Random Access Memory) 503, an outer memory device 504, such as a HDD (Hard Disk Drive), SSD (Solid State Drive), or CD (Compact Disc) drive device, a display device 505, such as a display, and an input device 506, such as a keyboard and/or mouse, are connected to each other via a bus 510.

The method of layouting an auxiliary pattern 380 described above is provided as a program. This program is provided in a state recorded, as a file of an installable format or executable format, in a nontransitory computer readable recording medium, such as a CD-ROM, flexible disk (FD), CD-R, DVD (Digital Versatile Disk), or memory card.

Further, a program for executing the method of layouting an auxiliary pattern 380 described above may be provided such that the program is stored in an information processing apparatus connected to a network, such as the internet, and is downloaded via the network. Further, a program for executing the method of layouting an auxiliary pattern 380 described above may be provided such that the program is provided or distributed via a network, such as the internet.

The information processing apparatus 500 develops this program in the RAM 503, and executes this program by the CPU 501, to execute the method of layouting an auxiliary pattern 380 described with reference to FIG. 8.

Figure 11C:
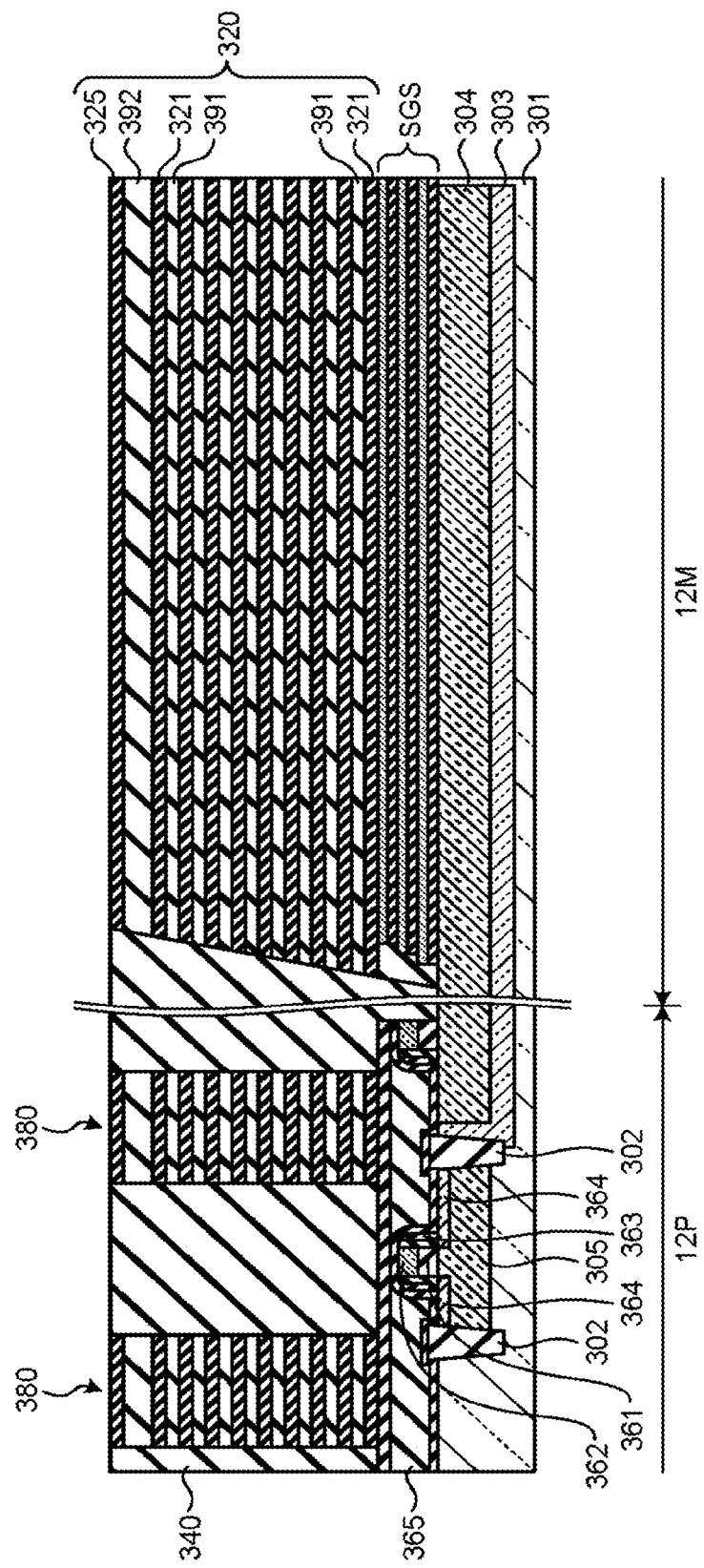

Next, an explanation will be given of a method of manufacturing a semiconductor memory device. FIGS. 11A to 11F are sectional views schematically showing an example of the sequence of a method of manufacturing a semiconductor memory device according to the embodiment. FIGS. 11A to 11F illustrate these sectional views at a position where a separation portion 371 is formed in the memory cell arrangement region 12M, and this position is different from the position of the sectional view shown in FIG. 6. Further, FIGS. 12A and 12B are partial top views schematically showing an example of the state of an auxiliary pattern, in the method of manufacturing a semiconductor memory device according to the embodiment.

Here, it is assumed that, on the semiconductor wafer 301, a peripheral circuit including the peripheral transistor 360 has already been formed in the peripheral circuit arrangement region 12P, and stacked films constituting the source-side selection transistor SGS have already been formed in the memory cell arrangement region 12M. Further, it is assumed that the upper sides of the peripheral circuit arrangement region 12P and the memory cell arrangement region 12M have already been planarized.

At first, as shown in FIG. 11A, a memory layer formation body 320 is formed over the peripheral circuit arrangement region 12P and the memory cell arrangement region 12M on the semiconductor wafer 301, i.e., the substrate. The memory layer formation body 320 includes a stacked body composed of a predetermined number of spacer films 321 and sacrificial films 391 alternately stacked, and further includes a sacrificial film 392 and an insulating film 325. In this example, the uppermost layer of the stacked body is terminated by a spacer film 321.

Each spacer film 321 may be made of an insulating material, such as a silicon oxide film, for example. The insulating film 325 only needs to be made of an insulating material different from the material of the sacrificial films 391 and 392, and may be made of the same material as the spacer films 321, for example.

The sacrificial films 391 and 392 may be made of a material that has a selective ratio relative to the spacer films 321 and the insulating film 325 when the memory layer formation body 320 is etched. Each of the sacrificial films 391 and 392 may be formed of a silicon nitride film, for example. The thickness of each of the spacer films 321 and the sacrificial films 391 may be set to several ten nm.

Thereafter, as shown in FIG. 11B, a resist is applied onto the memory layer formation body 320, and a resist pattern 393 is formed by use of a lithography technique and a development technique. The resist pattern 393 is formed by patterning such that parts of the resist remain on the memory cell arrangement region 12M and an auxiliary pattern arrangement region of the peripheral circuit arrangement region 12P. The auxiliary pattern arrangement region is a region obtained by the method of layouting an auxiliary pattern 380 described with reference to FIGS. 8 to 9B. Then, the memory layer formation body 320 is etched, through the resist pattern 393 serving as a mask, by use of an anisotropic etching technique, such as an RIE (Reactive Ion Etching) method. Consequently, parts of the memory layer formation body 320 are removed at the regions where circuit elements are formed in the peripheral circuit arrangement region 12P.

Thereafter, although not shown, etching is performed to have the sacrificial films 391 exposed in a stepwise state in a word line contact part of the memory cell arrangement region 12M. Then, a planarization film 340 is formed on the entire surface of the semiconductor wafer 301. Then, as shown in FIG. 11C, the part of the planarization film 340 present above the upper surface of the memory layer formation body 320 is planarized and thereby removed, by use of a CMP (Chemical Mechanical Polishing) method or the like. At this time, the memory layer formation body 320 is partly present not only on the memory cell arrangement region 12M but also on parts of the peripheral circuit arrangement region 12P, and so it is possible to suppress dishing, which is caused by over-polishing the planarization film 340 alone. Consequently, the upper surface of the peripheral circuit arrangement region 12P and the upper surface of the memory cell arrangement region 12M come to have the same height. As a result, it is possible to prevent occurrence of such a problem that an out-of-focus state is brought about in lithography performed in a subsequent step. The planarization film 340 may be made of an insulating material, such as a silicon oxide film.

Thereafter, although not shown, pillar members HP are formed in the memory cell arrangement region 12M, and beam portions (not shown) are formed in the memory cell arrangement region 12M and the peripheral circuit arrangement region 12P. More specifically, at first, a resist is applied onto the memory layer formation body 320, and a pattern is formed in the resist by use of a lithography technique and a development technique, such that this pattern can be used for forming memory holes in the memory cell arrangement region 12M. Then, the memory layer formation body 320 is etched, through the pattern formed in the resist serving as a mask, so that memory holes are formed. Thereafter, an ONO film and a semiconductor film, each of which has a hollow columnar shape, are formed on the sidewall of each memory hole. Then, a filler insulating film is embedded as the central portion in each memory hole. Consequently, the pillar members (not shown) are formed. Then, a resist is applied onto the memory layer formation body 320, and then a pattern is formed in the resist by use of a lithography technique and a development technique, such that this pattern can be used for forming beam portions in predetermined regions of the memory cell arrangement region 12M and the auxiliary pattern arrangement region of the peripheral circuit arrangement region 12P. Then, the stacked body is etched, through the pattern formed in the resist serving as a mask, so that holes for forming beam portions are formed. Thereafter, the resist is removed, and an insulating film, such as an SiO$_2$ film, is embedded in each of the holes for forming beam portions, so that the beam portions (not shown) are formed.

Figure 11D:
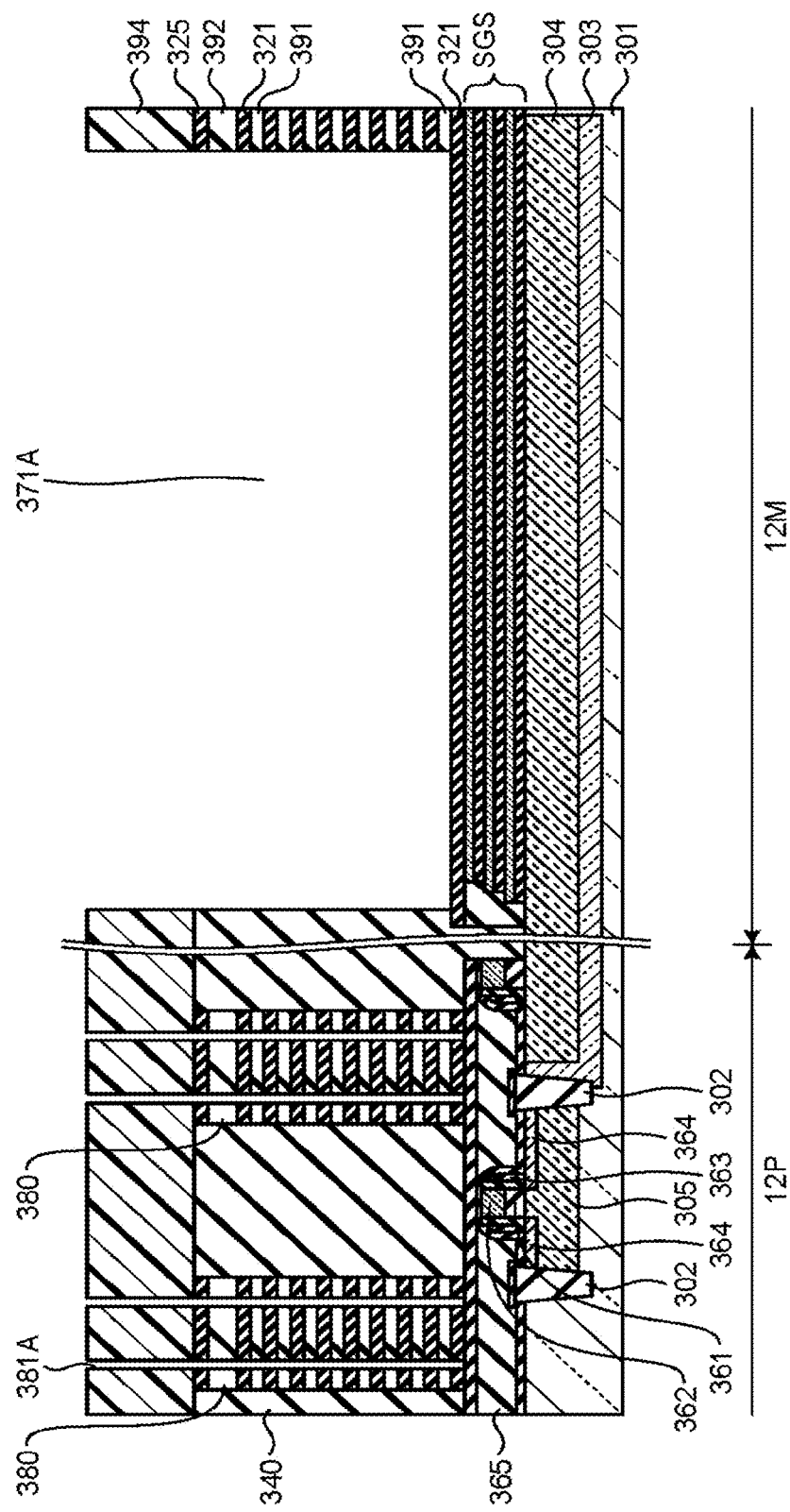
Figure 12A:
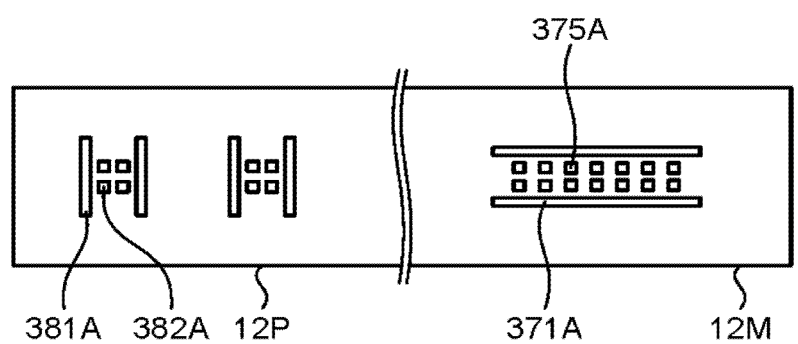
FIGS. 12A and 12B are partial top views schematically showing an example of the state of an auxiliary pattern, in the method of manufacturing a semiconductor memory device according to the embodiment.
Figure 12B:
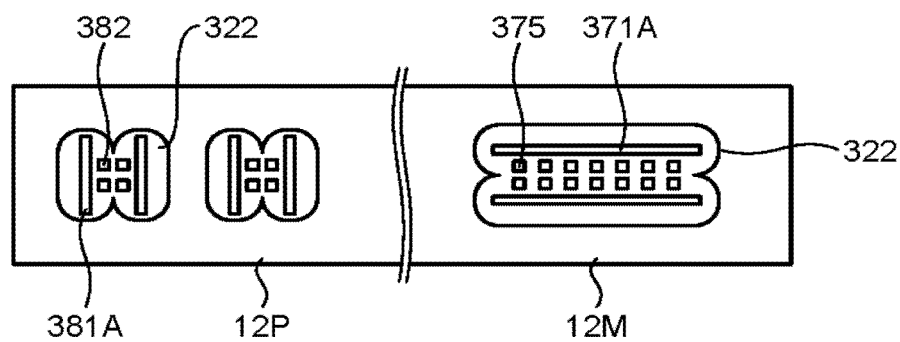

Thereafter, as shown in FIG. 11D, a resist is applied onto the entire surface of the memory layer formation body 320, and a resist pattern 394 is formed by use of a lithography technique and a development technique. This resist pattern 394 has openings in the memory cell arrangement region 12M and the auxiliary pattern arrangement region of the peripheral circuit arrangement region 12P. In the memory cell arrangement region 12M, linear openings extending in the word line direction are arranged at predetermined intervals in the bit line direction. Further, in the peripheral circuit arrangement region 12P, a plurality of linear openings intersecting with the word line direction are arranged in parallel with each other. Here, the openings in the peripheral circuit arrangement region 12P extend in the bit line direction, i.e., a direction perpendicular to the extending direction of the openings in the memory cell arrangement region 12M.

Further, the memory layer formation body 320 is etched, through the resist pattern 394 serving as a mask, by use of an anisotropic etching technique, such as an RIE method. Consequently, slits 371A and 381A are formed in the memory cell arrangement region 12M and the auxiliary pattern arrangement region of the peripheral circuit arrangement region 12P. As in the openings formed in the resist pattern 394, the slits 371A formed in the memory cell arrangement region 12M extend in the word line direction, and the slits 381A formed in the peripheral circuit arrangement region 12P extend in the bit line direction.

Figure 11E:
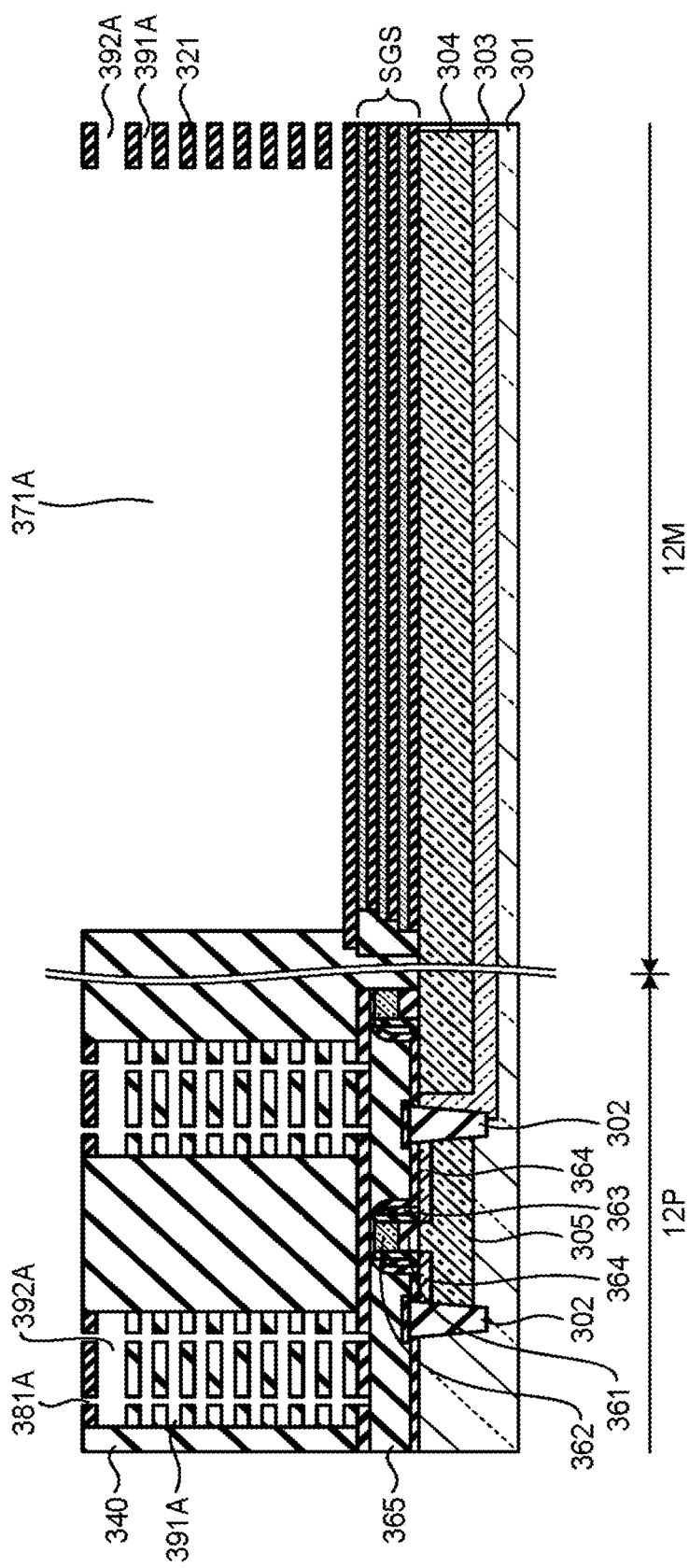

Then, as shown in FIGS. 11E and 12A, the sacrificial films 391 and 392 are removed by etching. For example, wet etching using hot phosphoric acid, or dry etching, such as CDE (Chemical Dry Etching), is performed, so that the sacrificial films 391 and 392 each formed of a silicon nitride film are removed. More specifically, the etchant comes in through the slits 371A and 381A formed as described above, and etches the sacrificial films 391 and 392 on the semiconductor wafer 301. Thus, gap spaces 391A and 392A are formed at the regions where the sacrificial films 391 and 392 have been present. As a result, a structure is provided such that the spacer films 321 and the insulating film 325 are supported by the side surfaces of the pillar members (not shown) and the side surfaces of the beam portions (not shown). At this time, the etching is performed under conditions by which the selective ratio of the sacrificial films 391 and 392 relative to the spacer films 321 and the insulating film 325 is set to be sufficiently large.

Thereafter, as shown in FIGS. 11F and 12B, an electrode film 322 is formed in a conformal state, by use of a film formation method, such as a CVD (Chemical Vapor Deposition) method, in the slits 371A and 381A and the gap spaces 391A and 392A. More specifically, the electrode film 322 is formed to cover the surfaces of the spacer films 321 and the insulating film 325 protruding in the direction parallel with the substrate surface, and to cover the side surfaces of the beam portions and the pillar members in contact with the gap spaces 391A and 392A. At this time, when seen in a plan view, the electrode film 322 is formed to avoid the positions of the beam portions and the pillar members. The electrode film 322 may be made of tungsten or the like. Here, FIG. 12B shows a view seen from the upper surface at the position where the electrode film is formed.

Then, the parts of the electrode film 322 deposited on the side surfaces of the insulating film 325 and the spacer films 321 in the slits 371A and 381A are removed, by use of anisotropic etching, such as an RIE method. Further, the insulating film 325, the spacer films 321, and the electrode films 322 thus obtained are etched, by use of anisotropic etching, such as an RIE method, so that the side surfaces of the slits 371A and 381A becomes almost flat.

Then, an insulating film, such as a silicon oxide film, is embedded in each of the slits 371A and 381A, so that the separation portions 371 and 381 are formed. Further, word line contacts 351 are formed to be connected to the electrode films of the word line contact part, and contacts 352 are formed to be connected to the circuit elements in the peripheral circuit arrangement region 12P. As a result, a semiconductor memory device is manufactured to have the structure shown in FIG. 6, for example. Thereafter, although not shown, an interlayer insulating film is further formed, and then wiring patterns are formed to be connected to the respective contacts 351 and 352.

According to this embodiment, the memory layer formation body 320 having the same layer structure as that in the memory cell arrangement region 12M is left in the regions where no circuit element is present inside the peripheral circuit arrangement region 12P, and this memory layer formation body 320 is provided with the separation portions 381 arranged in a direction intersecting with the word line direction. Thus, the electrode films 322 are present in the peripheral circuit arrangement region 12P, such that they extend in a direction intersecting with the word line direction. In this case, the electrode films 322 in the memory cell arrangement region 12M, which extend in the word line direction, tend to be warped in the extending direction, but the electrode films 322 in the peripheral circuit arrangement region 12P tend to be warped in the direction intersecting with the word line direction. As a result, there is provided an effect capable of relaxing warp of the semiconductor wafer 301 as a whole. Further, since the warp is relaxed, it is possible to realize a processing process with high accuracy. As a result, it is possible to reduce the manufacturing cost of a semiconductor memory device by improving the yield or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising a semiconductor substrate, which includes thereon a first region where memory elements are arranged and a second region where circuit elements driving the memory elements are arranged,
wherein the first region is provided with a stacked body including a plurality of metal films, the stacked body being divided into a plurality of parts by first separation portions extending in a first direction, and
the second region is provided with an auxiliary pattern, which includes the stacked body together with a separation portion pair including a pair of second separation portions that divide the stacked body, the second separation portions extending in a second direction intersecting with the first direction.

2. The semiconductor memory device according to claim 1, wherein the auxiliary pattern is arranged in a region where the circuit elements are not arranged.

3. The semiconductor memory device according to claim 1, wherein the second direction intersects with the first direction by an angle larger than 45°.

4. The semiconductor memory device according to claim 3, wherein the second direction intersects with the first direction by an angle of 90°.

5. The semiconductor memory device according to claim 1, wherein the auxiliary pattern further includes a beam portion extending from an upper side to a lower side of the stacked body, the beam portion being arranged in a region between two of the second separation portions of the separation portion pair.

6. The semiconductor memory device according to claim 5, wherein the beam portion is made of an insulating material.

7. The semiconductor memory device according to claim 1, wherein the stacked body is provided with columnar structure bodies arranged in a two-dimensional state, and the columnar structure bodies includes a first insulating layer, a charge accumulation layer, a second insulating layer, and a semiconductor layer stacked in this order from a side in contact with the stacked body.

8. A method of manufacturing a semiconductor memory device, the method comprising:
forming a stacked body by alternately stacking first insulating films and spacer films over a memory cell arrangement region and a peripheral circuit arrangement region on a semiconductor substrate;
etching the stacked body such that parts of the stacked body remain on an auxiliary pattern arrangement region of the peripheral circuit arrangement region and on the memory cell arrangement region;
forming first holes extending from an upper surface to a lower surface of the stacked body in the memory cell arrangement region and the auxiliary pattern arrangement region;
embedding an insulating film in the first holes;
forming first trenches extending from an upper surface to a lower surface of the stacked body in the memory cell arrangement region, and forming a trench pair including a pair of second trenches extending from the upper surface to the lower surface of the stacked body in the auxiliary pattern arrangement region, the first trenches extending in a first direction, and the second trenches extending in a second direction intersecting with the first direction;
removing the spacer films by etching through the first trenches; and
embedding a metal film in gaps generated by removing the spacer films.

9. The method of manufacturing a semiconductor memory device according to claim 8, wherein the second direction intersects with the first direction by an angle larger than 45°.

10. The method of manufacturing a semiconductor memory device according to claim 9, wherein the second direction intersects with the first direction by an angle of 90°.

11. The method of manufacturing a semiconductor memory device according to claim 8, wherein, in the forming of the first holes, the first hole in the auxiliary pattern arrangement region is arranged in a region between the pair of second trenches.

12. The method of manufacturing a semiconductor memory device according to claim 8, wherein, in the forming of the first trenches and the trench pair, a distance between the pair of second trenches is set to be twice or less a permeating distance of a material forming the metal film, by which the material causes permeation inside the gaps during the embedding a metal film.

13. The method of manufacturing a semiconductor memory device according to claim 8, wherein the auxiliary pattern arrangement region is a region where no circuit element is arranged.

14. The method of manufacturing a semiconductor memory device according to claim 8, the method further comprising:
after the etching of the stacked body and before the forming of the first trenches and the trench pair, forming second holes extending from an upper surface to a lower surface of the stacked body in the memory cell arrangement region; and forming a first insulating layer, a charge accumulation layer, a second insulating layer, and a semiconductor layer in this order on a side surface of the second holes.

15. The method of manufacturing a semiconductor memory device according to claim 8, wherein the first insulating films are made from a silicon nitride film, and the spacer films are made from a silicon oxide film.

16. The method of manufacturing a semiconductor memory device according to claim 8, the method further comprising:

after the etching of the stacked body, forming a second insulating film on the semiconductor substrate; and removing part of the second insulating film present above an upper surface of the stacked body, by use of a CMP method.

17. A computer program product including a nontransitory computer readable recording medium containing a plurality of instructions layouting an auxiliary pattern, which are executable by a computer, wherein the plurality of instructions cause the computer to execute:

reading a layout including a memory cell arrangement region where patterns of memory cells are arranged and a peripheral circuit arrangement region where patterns of circuit elements driving the memory cells are arranged;

extracting a plurality of patterns from inside the peripheral circuit arrangement region;

creating circles having predetermined radiuses by respectively using as centers apexes of extracted patterns;

setting a pattern arrangement candidate region to be in contact with the plurality of circles;

making a judgment as to whether an auxiliary pattern unit is arrangeable in the pattern arrangement candidate region; and arranging an auxiliary pattern including one or more auxiliary pattern units into the pattern arrangement candidate region, upon a result of the judgment that the auxiliary pattern unit is arrangeable in the pattern arrangement candidate region, the auxiliary pattern unit including a separation portion pair including a pair of first separation portions, and the first separation portions extending in a direction intersecting with an extending direction of second separation portions formed in the memory cell arrangement region.

18. The computer program product according to claim 17, wherein, in the extracting of the patterns, a pattern having a possibility of electrical short-circuiting with the auxiliary pattern when the auxiliary pattern is arranged is extracted.

19. The computer program product according to claim 17, wherein, in the arranging of the auxiliary pattern, the auxiliary pattern units are arranged, in a state connected in series in the extending direction of the first separation portions, into the pattern arrangement candidate region, or the auxiliary pattern units are arranged, in a state connected in parallel in a direction perpendicular to the extending direction of the first separation portions, into the pattern arrangement candidate region.

20. The computer program product according to claim 17, wherein the extending direction of the first separation portions intersects with the extending direction of the second separation portions by an angle larger than 45°.

* * * * *